(12) United States Patent
Devgan et al.

(10) Patent No.: US 7,434,188 B1
(45) Date of Patent: Oct. 7, 2008

(54) LITHOGRAPHICALLY OPTIMIZED PLACEMENT TOOL

(75) Inventors: Anirudh Devgan, Austin, TX (US);
Roderick Metcalfe, Farnham (GB);
Vivek Raghavan, Mountain View, CA (US); Alfred Wong, Brookline, MA (US)

(73) Assignee: Magma Design Automation, Inc., San Jose, CA (US)

( * ) Notice: Subject to any disclaimer, the term of this patent is extended or adjusted under 35 U.S.C. 154(b) by 7 days.

(21) Appl. No.: 11/372,557

(22) Filed: Mar. 9, 2006

(51) Int. Cl.
*G06F 17/50* (2006.01)
(52) U.S. Cl. ............................. 716/10; 716/9
(58) Field of Classification Search ............. 716/8–12
See application file for complete search history.

(56) References Cited

U.S. PATENT DOCUMENTS 6,691,297 B1 * 2/2004 Misaka et al. ............ 716/21
6,898,769 B2 * 5/2005 Nassif et al. .............. 716/5
2004/0010762 A1 * 1/2004 Habitz ..................... 716/4
2004/0107410 A1 * 6/2004 Misaka et al. ............ 716/8

* cited by examiner

*Primary Examiner*—Jack Chiang
*Assistant Examiner*—Binh C Tat
(74) *Attorney, Agent, or Firm*—Townsend & Townsend & Crew LLP

(57) ABSTRACT

A system and a method are disclosed for integrating the results of lithographic simulation into the physical synthesis process. The effects of lithographic variation are considered when selecting a cell from among a group of cells having equivalent function. Circuit design elements are placed and routed with consideration of the effects of lithographic variation on robustness, timing performance, and leakage current. Cells may be simulated under a variety of conditions and environments and the simulation results stored in a library for efficient lithographically optimized placements.

25 Claims, 6 Drawing Sheets

LITHOGRAPHICALLY OPTIMIZED PLACEMENT TOOL

BACKGROUND

1. Field of the Art

The present invention generally relates to the field of integrated circuit design, and more specifically, to the placement and routing of the elements of an integrated circuit design.

2. Description of the Related Art

In integrated circuit fabrication, lithographic techniques are often employed to create circuit features. In order to satisfy demand for smaller circuits consuming less power, fabrication techniques are continually pushed in the direction of producing smaller and smaller features. Existing lithographic technology is capable of creating circuit features of size of similar magnitude to that of the wavelength of light used to create the features themselves. As circuit features become smaller, common optical effects such as diffusion, diffraction, and dispersion begin to significantly influence the results achieved by the fabrication. When not properly accounted for, these optical effects can cause differences between the circuit layout and the circuit as fabricated. These differences can potentially affect the functionality of the circuit, such as the leakage current and timing performance. In certain circumstances, these optical effects can result in catastrophic yield loss.

To account for these optical effects, fabrication processes employ optical proximity correction. Optical proximity correction predistorts the image that will be lithographically imprinted so that the fabricated circuit may be closer in realization to the circuit as designed.

However, optical proximity correction must make assumptions about the fabrications conditions. In practice, the conditions used to fabricate a circuit will rarely match these optimal conditions exactly. Variation in the lithographic process ("lithographic variation"), such as variation in the exposure and in the focus of the lithographic process, tends to reduce the effectiveness of optical proximity correction. Even with optical proximity correction, certain fabrication conditions can potentially affect the functionality of the fabricated circuit.

Certain circuit patterns are more sensitive to the effects of lithographic variation than other circuit patterns. The placement and routing of a circuit will affect the functionality, timing performance, and leakage current of the circuit under lithographic variation. Lithographic fabrication can be improved by designing the physical layout between circuit elements to include more robust and less lithographically sensitive circuit patterns.

Physical synthesis tools sometimes use restrictive design rules to limit the placement of circuit elements to patterns and relationships that are known to have a high probability of successful lithographic fabrication. However, restrictive design rules significantly limit the place and route tool, and applying generalized rules often results in sub-optimal designs, as the rules are followed even in circumstances when they are not strictly necessary. While restrictive design rules improve the probability of successful lithographic fabrication, they are often overly restrictive and result in a significant increase in the area occupied by a circuit. As reducing circuit size is a goal of most integrated circuit design, the increase in circuit size caused by restrictive design rules is usually an undesirable result.

From the above, there is a need for a system and method to evaluate the optical effects that will occur during lithography and to place and route circuit elements in a manner that will result in successful lithographic fabrication.

SUMMARY

One embodiment of a disclosed method (and system) includes analyzing the results of a lithographic simulation and moving circuit elements to improve the performance of the circuit under lithographic variation.

According to one embodiment of the present invention, a first cell is placed in one location and a second cell is placed in another location. A lithographic simulation is performed on the first cell to produce environment data. The resulting environment data and the location of the second cell are analyzed to determine if the sensitivity of the circuit to lithographic variation is reducible by moving the first cell. If the sensitivity of the circuit to lithographic variation is reducible by moving the first cell, the first cell is moved.

According to another embodiment of the present invention, a first cell is placed in one location and a second cell is placed in another location. A lithographic simulation is performed on the first cell to produce lithographically sensitive leakage current data. The resulting lithographically sensitive leakage current data and the location of the second cell are analyzed to determine if the leakage current of the circuit under lithographic variation is improvable by moving the first cell. If the leakage current of the circuit under lithographic variation is improvable by moving the first cell, the first cell is moved.

According to another embodiment of the present invention, a first cell is placed in one location and a second cell is placed in another location. A lithographic simulation is performed on the first cell to produce lithographically sensitive timing data. The resulting lithographically sensitive timing data and the location of the second cell are analyzed to determine if the timing performance of the circuit under lithographic variation is improvable by moving the first cell. If the timing performance of the circuit under lithographic variation is improvable by moving the first cell, the first cell is moved.

According to another embodiment of the present invention, a cell characterization performs lithographic simulation on a cell and generates lithographically sensitive characterization data data. A physical synthesis module performs physical synthesis on the circuit, which includes placing the cell in a first location. A lithographic analysis module has as input the lithographically sensitive characterization data resulting from the cell characterization and the first location resulting from the physical synthesis. The lithographic analysis module places the cell in a second location if the sensitivity of the circuit to lithographic variation is improvable by moving the cell.

According to one embodiment of the present invention, a lithographic simulation is performed on a cell to generate robustness data. The robustness data is analyzed to determine potential changes to the sensitivity of the circuit to lithographic variation resulting from placing the cell into the circuit, and a robustness score is generated. The robustness score is indicative of the potential changes to the sensitivity of the circuit to lithographic variation resulting from placing the cell into the circuit. Responsive to the robustness score, a determination is made to place the first cell into the circuit.

The features and advantages described in the specification are not all inclusive and, in particular, many additional features and advantages will be apparent to one of ordinary skill in the art in view of the drawings, specification, and claims. Moreover, it should be noted that the language used in the specification has been principally selected for readability and instructional purposes, and may not have been selected to delineate or circumscribe the inventive subject matter.

BRIEF DESCRIPTION OF THE DRAWINGS

The disclosed embodiments have other advantages and features which will be more readily apparent from the following detailed description and the appended claims, when taken in conjunction with the accompanying drawings, in which:

DETAILED DESCRIPTION

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

Also, use of the "a" or "an" are employed to describe elements and components of the invention. This is done merely for convenience and to give a general sense of the invention. This description should be read to include one or at least one and the singular also includes the plural unless it is obvious that it is meant otherwise.

The Figures (FIGS.) and the following description relate to preferred embodiments of the present invention by way of illustration only. It should be noted that from the following discussion, alternative embodiments of the structures and methods disclosed herein will be readily recognized as viable alternatives that may be employed without departing from the principles of the claimed invention.

Reference will now be made in detail to several embodiments, examples of which are illustrated in the accompanying figures. It is noted that wherever practicable similar or like reference numbers may be used in the figures and may indicate similar or like functionality. The figures depict embodiments of the present invention for purposes of illustration only. One skilled in the art will readily recognize from the following description that alternative embodiments of the structures and methods illustrated herein may be employed without departing from the principles described herein.

According to one embodiment of the present invention, at least some of the systems and methods described herein are embodied in a physical synthesis tool. Some of the lithographic simulations for reusable circuit elements may be performed before physical synthesis, and the results of these simulations may persist, for example in a library, for future consultation.

Figure 1:
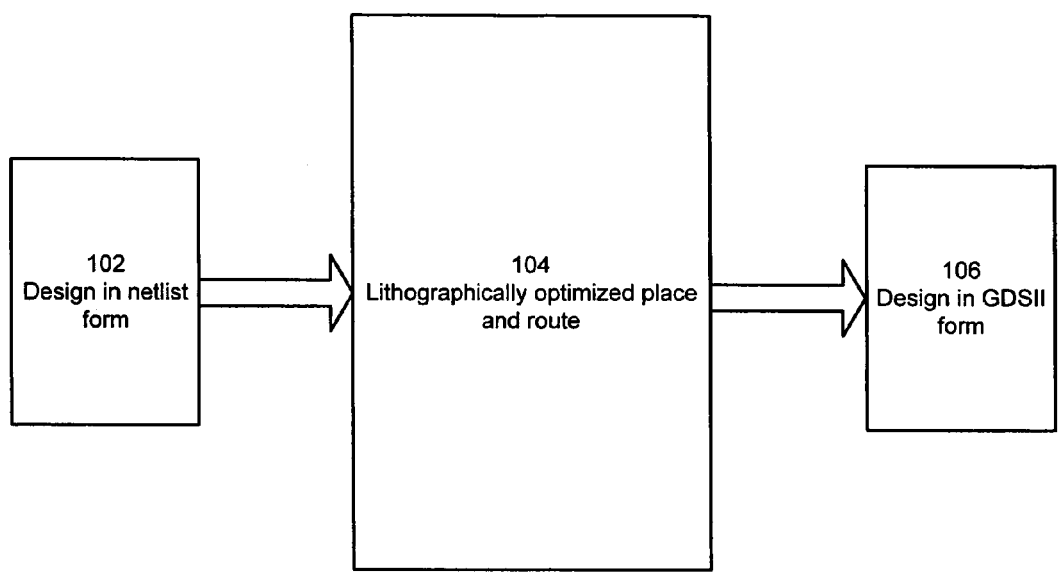
FIG. 1 illustrates one embodiment of the operation of a lithographically optimized place and route, according to one embodiment of the present invention.

FIG. 1 illustrates one embodiment of the operation of a lithographically optimized place and route module. The module operate on a design in netlist form 102. The design in netlist form 102 describes how circuit elements are connected. A design in netlist form has been selected for the purposes of illustration as an example of a description of the connections of an electronic circuit design. Other methods for describing a circuit design may be implemented without departing from the scope of the present invention, and should be understood to be applicable throughout the description contained herein.

The lithographically optimized place and route 104 operates on the design in netlist form 102 to produce a design in GDSII form 106. The design in GDSII form 106 specifies the connections between circuit elements and the physical layout of the circuit. A design in GDSII form has been selected for the purposes of illustration as an example of a description from which an electronic circuit can be fabricated. Other methods for describing a circuit design may be implemented without departing from the scope of the present invention, and should be understood to be applicable throughout the description contained herein.

The design 106 includes at least one cell. A cell is a group of circuit elements that together have a predefined functionality. A cell may be implemented, for example, as a gate level description of circuit elements.

Figure 2:
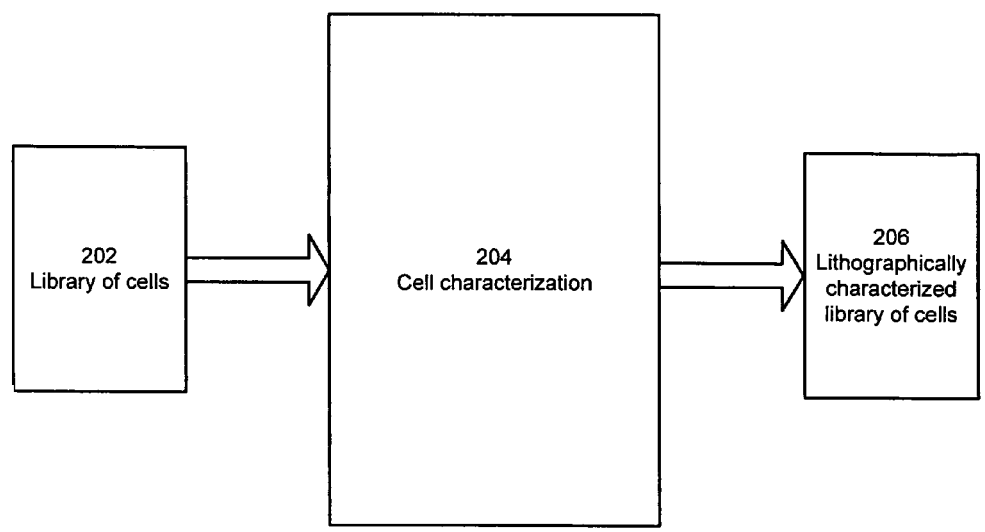
FIG. 2 illustrates one embodiment of the application of cell characterization.

FIG. 2 illustrates one embodiment of the application of cell characterization 204, according to one embodiment of the present invention. A library of cells 202 contains descriptions of cells. According to one embodiment of the present invention, at least some of the cells in the library are described in both netlist and GDSII forms. A cell characterization 204 operates on the library of cells 202 to produce a lithographically characterized library of cells 206. The flow of data in the cell characterization 204, according to one embodiment of the present invention, is described herein with reference to FIG. 3. The lithographically characterized library of cells 206 contains descriptions of cells, as well as the results of lithographic simulation for at least some of the cells described in the library. The results of lithographic simulation could include, for example, environment data, lithographically sensitive timing data, lithographically sensitive leakage current data, or a robustness score. Storing the results of a lithographic simulation related to a cell is beneficial for the efficient implementation of a lithographically optimized placement tool, as the results of a simulation may be reused for multiple placements of the same or a similar cell.

According to one embodiment of the present invention, the cell characterization method operates concurrently with the method for lithographically optimized place and route, and the lithographically optimized place and route may receive the output of the cell characterization 204 directly, thereby bypassing storage in the lithographically characterized library of cells 206.

Figure 3:
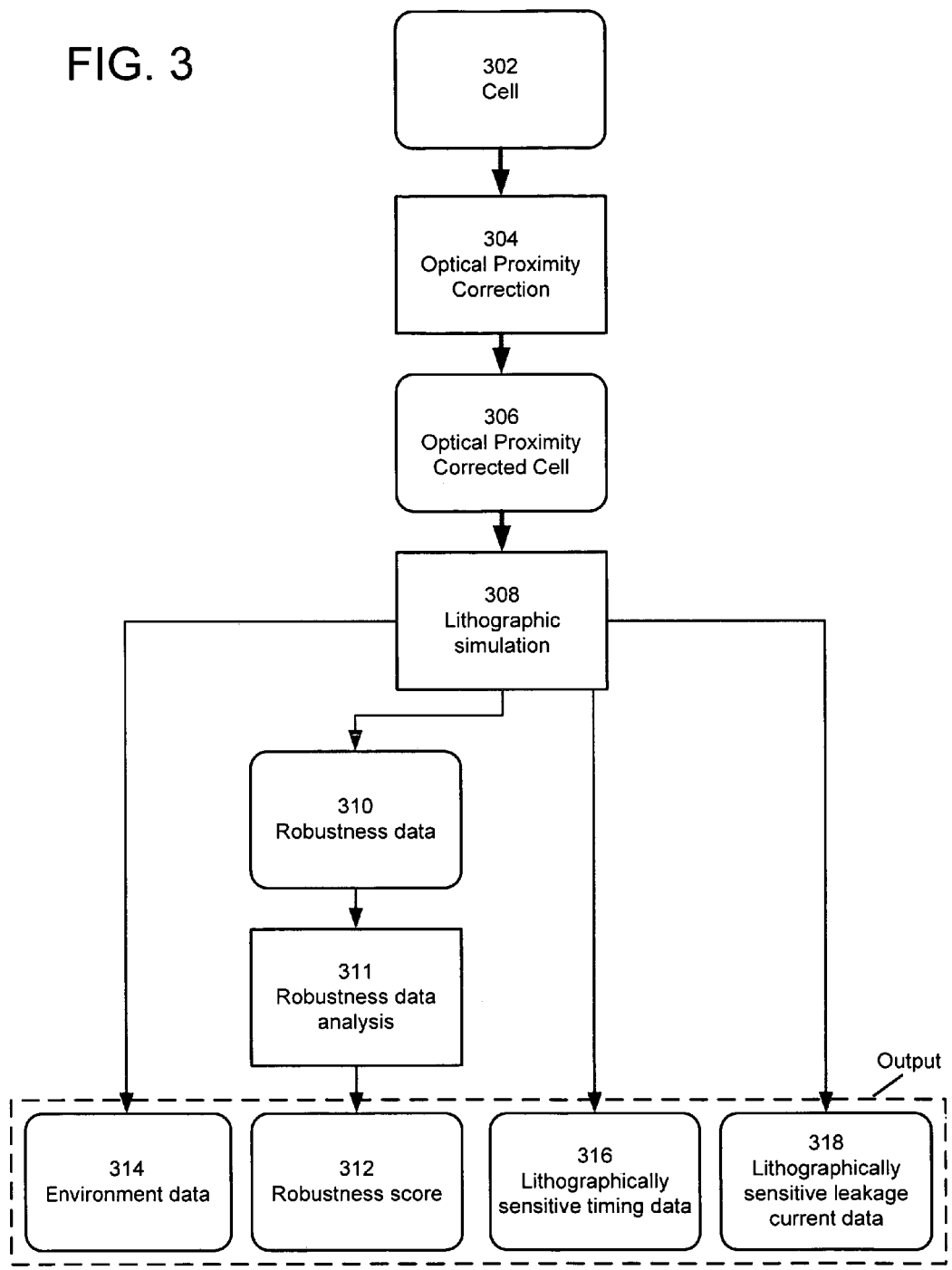
FIG. 3 illustrates one embodiment of flow of data in the cell characterization.

FIG. 3 illustrates one embodiment of flow of data in the cell characterization 204, according to one embodiment of the present invention. The cell characterization 204 operates on a cell 302. The cell 302 may be a member of a larger collection of cells, for example, the library of cells 202 described herein with reference to FIG. 2. According to one embodiment of the present invention, the cell 302 is in GDSII form.

The cell characterization 204 performs optical proximity correction 304 on the cell 302. The cell characterization 204 may perform optical proximity correction 304 using conventional methods for predistorting a circuit design in preparation for lithographic fabrication. For example, optical proximity correction may be performed using commercially available software products such as Calibre RET (produced by Mentor Graphics of San Jose, Calif.) or Taurus (produced by Synopsys of Mountain View, Calif.), or by using a similar method. The cell characterization 204 may use either rule- or model-based methods for the optical proximity correction 304. According to one embodiment of the present invention, the cell characterization 204 uses a method for the optical proximity correction 304 involving lithographic simulation, for example, as in model-based optical proximity correction.

According to one embodiment of the present invention, the cell characterization 204 performs multiple optical proximity corrections 304 on the cell 302 for correction under varying environmental conditions. For example, the cell characterization 204 performs optical proximity correction on the cell 302 with nearby circuit elements of a first type and location and then performs optical proximity correction on the cell 302 with nearby circuit elements of a second type and location. Environmental conditions specify the type and/or location of the elements within various proximities to a given circuit element. For the purposes of illustration, a single optical proximity correction is shown, but it will be understood by one of ordinary skill in the art that in practice a series of optical proximity corrections may be performed.

Performing the optical proximity correction 304 results in an optical proximity corrected cell 306. The optical proximity corrected cell 306 has been predistorted and is in GDSII form. According to one embodiment of the present invention, the cell characterization 204 performs multiple optical proximity corrections 304 on the cell 302 for correction under varying environment conditions, and a plurality of optical proximity corrected cells 306 under varying environment conditions are produced.

The cell characterization 204 performs lithographic simulation 308 on the optical proximity corrected cell 306. Lithographic simulation may be implemented, for example, by analyzing the predistorted layout of the cell and predicting the results of a lithographic fabrication of that cell or circuit under specified fabrication conditions. The cell characterization 204 simulates lithography under a variety of fabrication conditions, for example, with variations in the exposure and focus of the lithographic fabrication.

Performing the lithographic simulation 308 results in environment data 314. The environment data 314 indicates the expected robustness of the cell 302 under the environmental condition of the optical proximity correction 304, or under the varying environmental conditions of the multiple optical proximity corrections 304. Robustness refers to the likelihood of an open or short in the cell as a function of lithographic variation.

Performing the lithographic simulation 308 results in lithographically sensitive timing data 316. The lithographically sensitive timing data 316 indicates the expected timing performance under lithographic variation of the cell 302 under the environmental condition of the optical proximity correction 304, or under the varying environmental conditions of the multiple optical proximity corrections 304.

Performing the lithographic simulation 308 results in lithographically sensitive leakage current data 318. The lithographically sensitive leakage current data 318 indicates the expected leakage current under lithographic variation of the cell 302 under the environmental condition of the optical proximity correction 304, or under the varying environmental conditions of the multiple optical proximity corrections 304.

Performing the lithographic simulation 308 results in robustness data 310. The robustness data 310 indicates the expected robustness of the cell 302. The cell characterization 204 performs robustness data analysis 311 to produce a robustness score 312. Robustness data analysis 311 can include, for example, weighted analysis of the likelihood of catastrophic opens or shorts as a result of variations in the exposure and focus of the lithographic fabrication. Robustness data analysis 311 determines the potential changes to the sensitivity of a circuit to lithographic variation caused by placing the cell 302 in the circuit. The robustness data analysis 311 generates a robustness score, which describes the relative magnitude of these potential changes to the sensitivity of a circuit to lithographic variation.

The cell characterization 204 produces as output a robustness score 312, environment data 314, lithographically sensitive timing data 316, and lithographically sensitive leakage current data 318. Robustness metrics, environment data, lithographically sensitive timing data, lithographically sensitive leakage current data, and timing and leakage models have been selected for the purposes of illustration as examples of lithographically sensitive characterization data. Other embodiments of lithographically sensitive characterization data, such as timing may be implemented without departing from the scope of the present invention.

The cell characterization 204 is beneficial for improving the effectiveness of lithographic fabrication, as the results of the lithographic simulation may be used to improve the robustness, leakage current, and timing performance of a circuit under lithographic variation.

Figure 4:
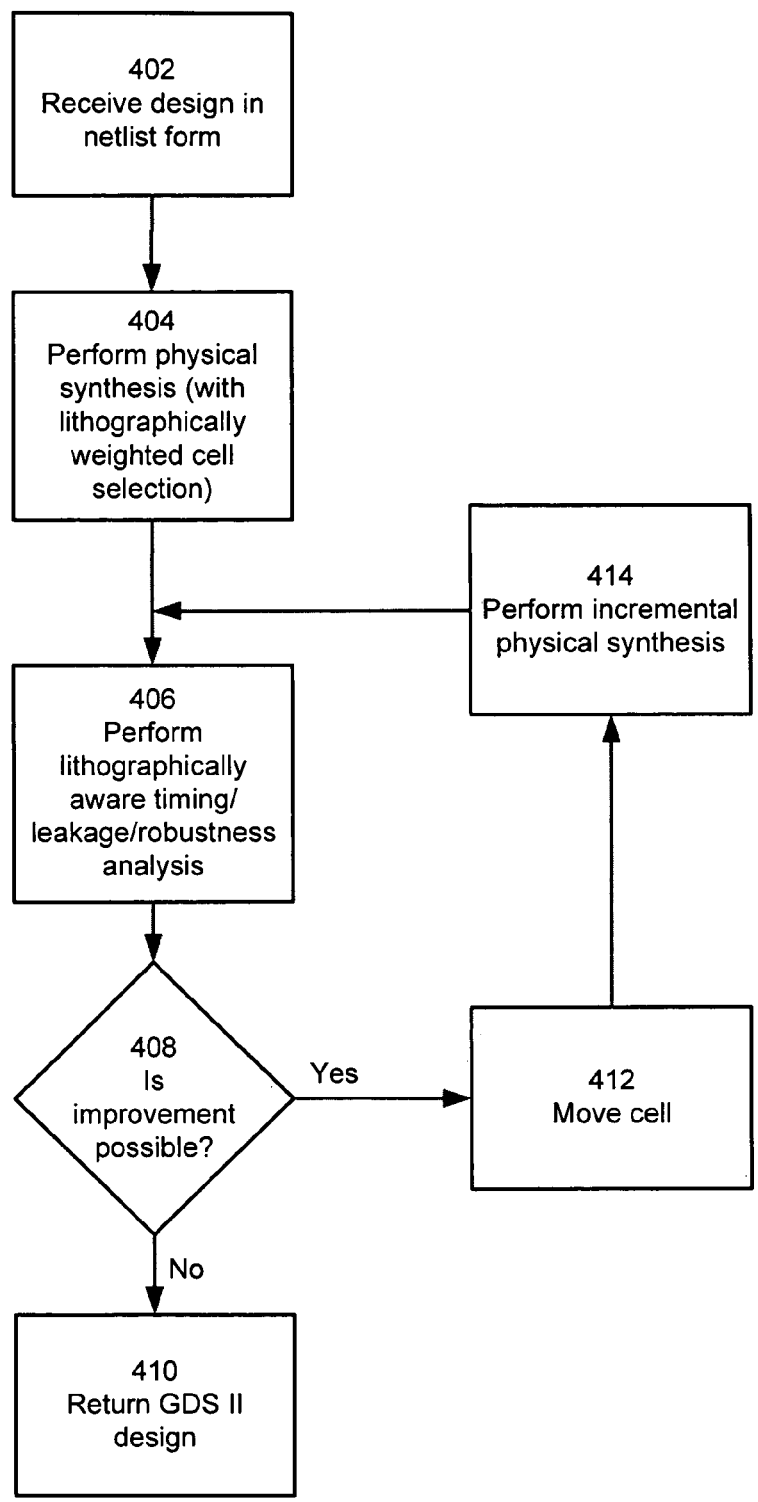
FIG. 4 illustrates one embodiment of a method for lithographically optimized place and route.

FIG. 4 illustrates one embodiment of a method for lithographically optimized place and route, according to one embodiment of the present invention. According to one embodiment of the present invention, the method is performed by a lithographically optimized place and route.

The lithographically optimized place and route receives 402 a design in netlist form. The design received 402 by the lithographically optimized place and route may be analogous to the design 102 described herein with reference to FIG. 1.

The lithographically optimized place and route performs 404 physical synthesis. Physical synthesis may include selecting a cell from among a group of cells having an equivalent function, or from among a group of cells that can be combined to have an equivalent function. The lithographically optimized place and route selects a cell using a method of lithographically weighted cell selection, for example the method described herein with reference to FIG. 5.

Physical synthesis includes placement, routing, and optimization of the design in netlist form to produce a design in GDSII form. The placement of a design containing circuit elements such as cells, results in the establishment of physical layouts between the circuit elements.

The lithographically optimized place and route performs 406 lithographically aware analysis. The flow of data in the lithographically aware analysis is described herein with reference to FIG. 6.

According to one embodiment of the present invention, the analysis includes examining the physical layout of the cells placed in physical synthesis in conjunction with the environment data 314 of the various cells to determine if the sensitivity of the circuit to lithographic variation can be reduced by changing the physical layout of the cells.

According to another embodiment of the present invention, the analysis includes examining the physical layout between the cells placed in physical synthesis in conjunction with the lithographically sensitive timing data 316 of the various cells to determine if the timing performance of the circuit under lithographic variation can be improved by changing the physical layout of the cells.

According to still another embodiment of the present invention, the analysis includes examining the physical layout between the cells placed in physical synthesis in conjunction with the lithographically sensitive leakage current data 318 of the various cells to determine if the leakage current of the circuit under lithographic variation can be reduced by changing the physical layout between the cells.

The lithographically optimized place and route determines 408 if improvement to the placement and routing of the cells can be improved, for example, to increase robustness, to reduce leakage current, or to optimize timing performance.

If the lithographically optimized place and route determines 408 that improvement can be made, the lithographically optimized place and route moves 412 one of the cells placed in physical synthesis. Moving one of the cells has been selected for the purposes of illustration as an example of a method for changing the physical layout between cells in the design. Multiple cells can be moved, either separately or in conjunction, or their physical layout otherwise modified for the purpose of improving circuit performance under lithographic variation without departing from the scope of the present invention.

Determining if improvement to the placement and routing of the cells can be improved is beneficial, as it allows the lithographically optimized place and route to change the physical layout between circuit elements to improve the performance of the circuit under lithographic variation.

The lithographically optimized place and route performs 414 incremental physical synthesis to revise the design in GDSII form. For example, incremental physical synthesis may include rerouting and re-optimizing the design after the moving 412 at least one of the cells.

The lithographically optimized place and route returns to perform 406 lithographically aware analysis on the revised design. If the lithographically optimized place and route determines 408 that no improvement can be made, the lithographically optimized place and route returns 410 a GDSII design. The GDSII design returned 410 by the lithographically optimized place and route may be analogous to the design 106 described herein with reference to FIG. 1.

Figure 5:
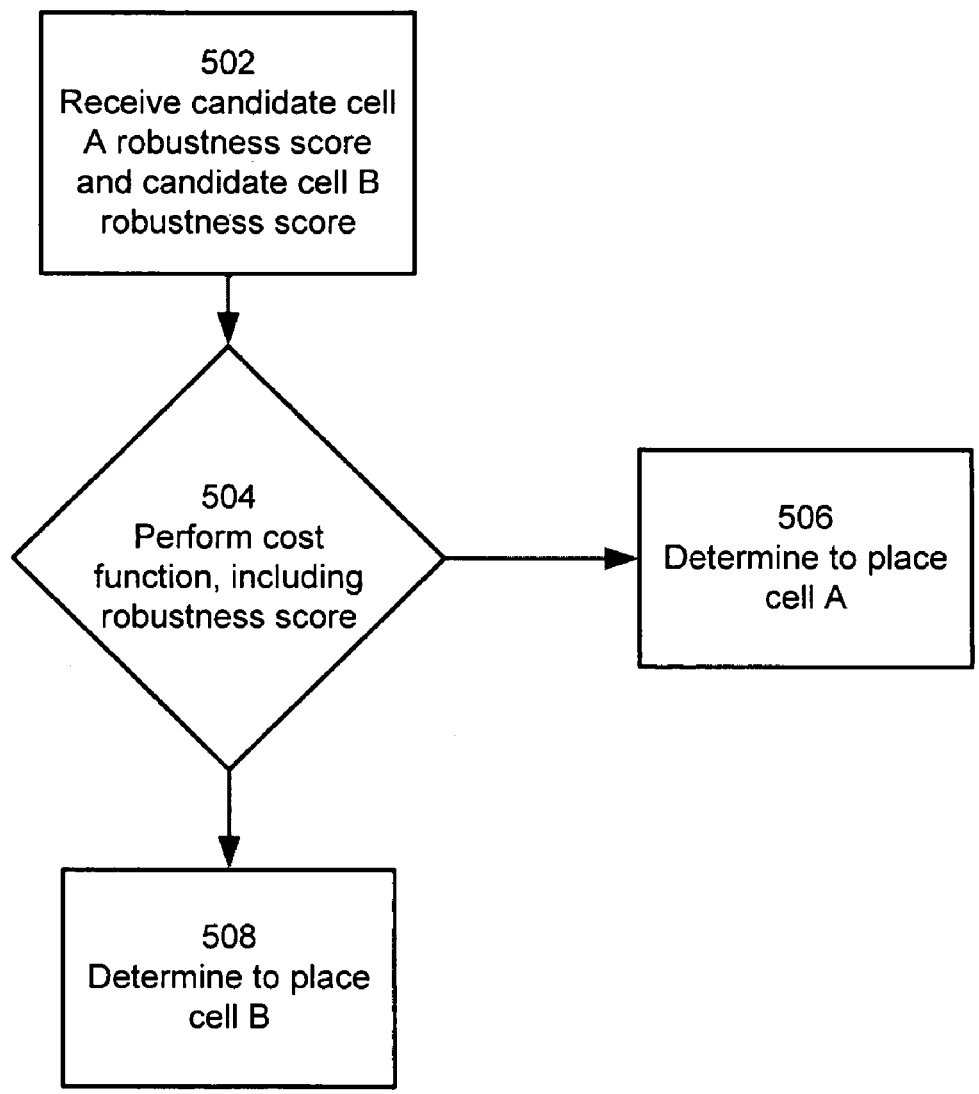
FIG. 5 illustrates one embodiment of a method for lithographically weighted cell selection.

FIG. 5 illustrates one embodiment of a method for lithographically weighted cell selection. The method may be performed by the lithographically optimized place and route during physical synthesis. Physical synthesis includes selecting a cell from among a group of cells having an equivalent function, or from among a group of cells that can be combined to have an equivalent function. For the purposes of illustration, the lithographically optimized place and route is depicted as selecting between two cells. However, the lithographically optimized place and route may select from among a plurality of cells, or a plurality of groups of cells, in making a lithographically weighted cell selection.

The lithographically optimized place and route receives 502 the robustness score of a candidate cell A and the robustness score of a candidate cell B. Each robustness score may be analogous to the robustness score 312 described herein with reference to FIG. 3.

The lithographically optimized place and route performs 504 a cost function comparing the relative strengths of cell A and cell B, wherein the robustness scores of cell A and cell B are among the inputs to the cost function. The cost function performed 504 by the lithographically optimized place and route may also consider, for example, the leakage current, timing, size, or complexity of the cells in order to determine whether to place cell A or to place cell B. Responsive to the cost function, the lithographically optimized place and route either determines 506 to place cell A or determines 508 to place cell B.

Figure 6:
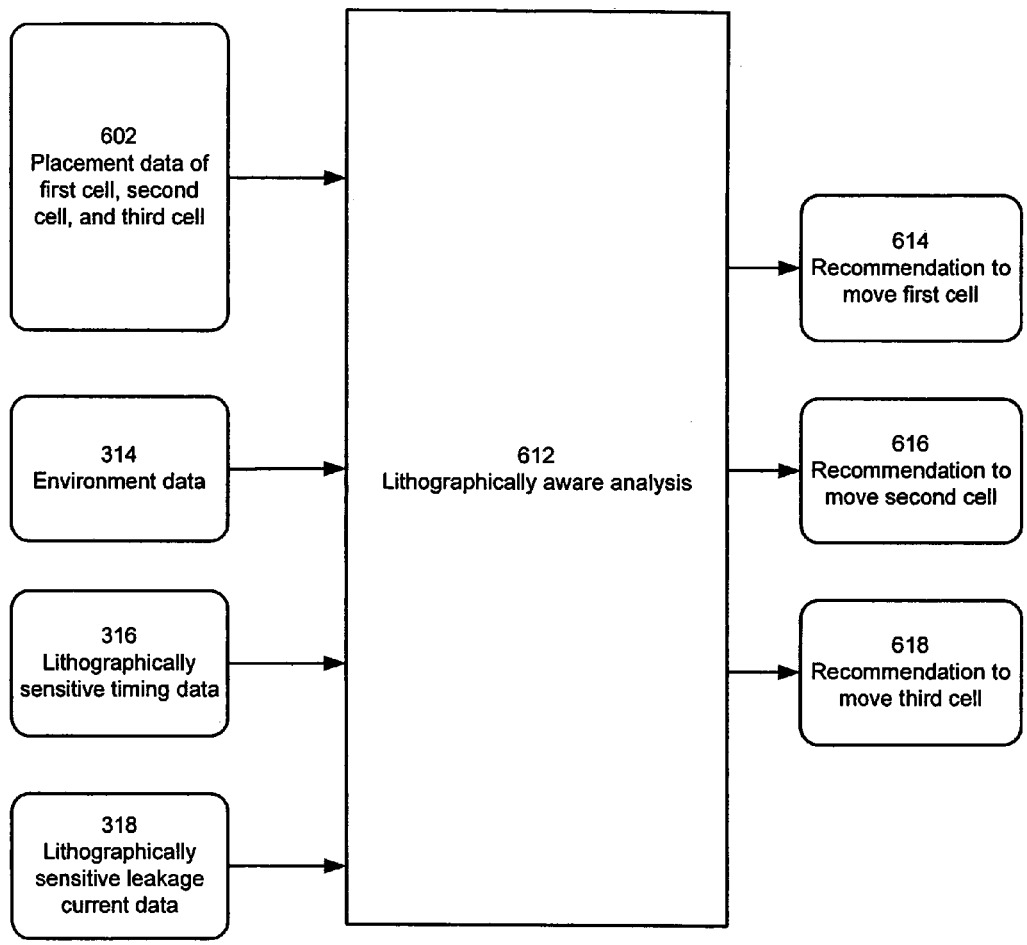
FIG. 6 illustrates one embodiment of flow of data in the lithographic analysis.

FIG. 6 illustrates one embodiment of the flow of data in the lithographic analysis. The placement data of a first cell, second cell, and third cell 602 includes data describing the physical layout between the three cells in the circuit layout.

The lithographically aware analysis 612 determines if the robustness, leakage current, or timing performance of the circuit under lithographic variation can be improved based on the physical layout between the three cells, the environment data 314, the lithographically sensitive timing data 316, and the lithographically sensitive leakage current data 318. The lithographically aware analysis 612 may return a recommendation to change the physical layout between the cells. Depending on the results of the determination, the lithographically aware analysis may return a recommendation to move the first cell 614, a recommendation to move the second cell 616, or a recommendation to move the third cell 618. Moving one of the cells may be beneficial for improving the sensitivity of the circuit to lithographic variation.

Advantages of the present invention include an improvement in the robustness, leakage current, and timing performance of the circuit under lithographic variation. Furthermore, as the placement of specific cells is analyzed in relation to specific environmental conditions, the present invention increases design flexibility over typical restrictive design rules. As a result, the present invention may be used to improve the results of the lithographic fabrication process with only slight increases in the area of the circuit. Therefore, the effects of lithographic fabrication may be simulated and accounted for while minimizing the resulting increase in area of the finished circuit.

Upon reading this disclosure, those of skill in the art will appreciate still additional alternative structural and functional designs for a system and a process for considering the effects of lithographic variation in the placement and selection of circuit elements through the disclosed principles herein. Thus, while particular embodiments and applications have been illustrated and described, it is to be understood that the present invention is not limited to the precise construction and components disclosed herein and that various modifications, changes and variations which will be apparent to those skilled in the art may be made in the arrangement, operation and details of the method and apparatus of the present invention disclosed herein without departing from the spirit and scope of the invention as defined in the appended claims.

What is claimed is:

1. In a circuit design comprised of cells and having a sensitivity to lithographic variation, a method for placing the cells to minimize the sensitivity of the design to lithographic variation, the method comprising:

placing a first cell into a first location;

placing a second cell into a second location;

performing a lithographic simulation on said first cell representative of the likelihood of failure of said first cell in response to a plurality of fabrication conditions indicative of lithographic variation;

generating environment data from said lithographic simulation;

analyzing said environment data and said second location to determine if the sensitivity of the circuit design to lithographic variation is reducible by moving said first cell;

moving said first cell in response to determining that the sensitivity of the circuit design to lithographic variation is reducible by moving said first cell;

performing a lithographic simulation on said second cell representative of the likelihood of failure of said second cell in response to a plurality of fabrication conditions indicative of lithographic variation to produce additional environment data, wherein said analyzing said environment data comprises analyzing said additional environment data; and performing optical proximity correction on said first cell to produce optical data, and wherein said lithographic simulation on said first cell is performed on said optical data.

2. The method of claim 1, wherein said environment data is stored in a cell library.

3. The method of claim 1, wherein said plurality of fabrication conditions comprise a plurality of variations in lithographic exposure.

4. The method of claim 1, wherein said plurality of fabrication conditions comprise a plurality of variations in lithographic focus.

5. The method of claim 1, further comprising
performing optical proximity correction on said second cell to produce additional optical data, and wherein said lithographic simulation is performed on said additional optical data.

6. The method of claim 1, wherein said analyzing additionally comprises analyzing said first location.

7. In a circuit design having a sensitivity to lithographic variation, a method for determining whether to place a first cell into the circuit design, the method comprising:

performing a lithographic simulation on the first cell in response to a plurality of fabrication conditions indicative of lithographic variation to generate robustness data;

analyzing said robustness data to determine potential changes to the sensitivity of the circuit design to lithographic variation resulting from placing the first cell into the circuit design;

generating a robustness score indicative of the potential changes to the sensitivity of the circuit design to lithographic variation resulting from placing the first cell into the circuit design;

determining to place the first cell into the circuit design, wherein the determination is responsive to the robustness score;

performing a lithographic simulation on a second cell representative of the likelihood of failure of the second cell in response to a plurality of fabrication conditions indicative of lithographic variation to produce additional robustness data, wherein the analyzing the robustness data comprises analyzing the additional robustness data; and performing optical proximity correction on the first cell to produce optical data, and wherein the lithographic simulation on the first cell is performed on the optical data.

8. The method of claim 7, wherein said robustness score is stored in a cell library.

9. In a circuit design comprised of cells and having timing performance under lithographic variation, a method for placing the cells to optimize the timing performance under lithographic variation, the method comprising:

placing a first cell into a first location;
placing a second cell into a second location;

performing a lithographic simulation on said first cell in response to a plurality of fabrication conditions indicative of lithographic variation to generate lithographically sensitive timing data;

analyzing said lithographically sensitive timing data and said second location to determine if the timing performance under lithographic variation of the circuit design is improvable by moving said first cell;

moving said first cell in response to determining that the timing performance under lithographic variation of the circuit design is improvable by moving said first cell;

performing a lithographic simulation on said second cell representative of the likelihood of failure of said second cell in response to a plurality of fabrication conditions indicative of lithographic variation to produce additional environment data, wherein said analyzing said environment data comprises analyzing said additional environment data; and performing optical proximity correction on said first cell to produce optical data, and wherein said lithographic simulation on said first cell is performed on said optical data.

10. The method of claim 9, wherein said lithographically sensitive timing data is stored in a cell library.

11. The method of claim 9, wherein said plurality of fabrication conditions comprise a plurality of variations in lithographic exposure.

12. The method of claim 9, wherein said plurality of fabrication conditions comprise a plurality of variations in lithographic focus.

13. The method of claim 9, further comprising
performing optical proximity correction on said second cell to produce additional optical data, and wherein said lithographic simulation is performed on said additional optical data.

14. The method of claim 9, wherein said analyzing additionally comprises analyzing said first location.

15. In a circuit design comprised of cells and having a leakage current under lithographic variation, a method for placing the cells to minimize the leakage current under lithographic variation, the method comprising:

placing a first cell into a first location;
placing a second cell into a second location;

performing a lithographic simulation on said first cell in response to a plurality of fabrication conditions indicative of lithographic variation to generate lithographically sensitive leakage current data;

analyzing said lithographically sensitive leakage current data and said second location to determine if the leakage current under lithographic variation of the circuit design is improvable by moving said first cell;

moving said first cell in response to determining that the leakage current under lithographic variation of the circuit design is improvable by moving said first cell;

performing a lithographic simulation on said second cell representative of the likelihood of failure of said second cell in response to a plurality of fabrication conditions indicative of lithographic variation to produce additional lithographically sensitive leakage current data, wherein said analyzing said lithographically sensitive leakage current data comprises analyzing said additional lithographically sensitive leakage current data; and performing optical proximity correction on said first cell to produce optical data, and wherein said lithographic simulation on said first cell is performed on said optical data.

16. The method of claim 15, wherein said lithographically sensitive leakage current data is stored in a cell library.

17. The method of claim 15, wherein said plurality of fabrication conditions comprise a plurality of variations in lithographic exposure.

18. The method of claim 15, wherein said plurality of fabrication conditions comprise a plurality of variations in lithographic focus.

19. The method of claim 15, further comprising
performing optical proximity correction on said second cell to produce additional optical data, and wherein said lithographic simulation is performed on said additional optical data.

20. The method of claim 15, wherein said analyzing additionally comprises analyzing said first location.

21. A system for performing lithographically aware physical synthesis for a circuit design, said circuit design comprising a cell and having a sensitivity to lithographic variation, the system comprising:
a cell characterization module configured to perform lithographic simulation on a first and second cell in response to a plurality of fabrication conditions indicative of lithographic variation to produce lithographically sensitive characterization data, wherein optical proximity correction is performed on the first cell to produce optical data, and wherein the lithographic simulation is performed on said optical data;
a physical synthesis module configured to perform physical synthesis on the circuit design, said physical synthesis comprising placing said cell in a first location;
a lithographic analysis module, having as input said lithographically sensitive characterization data and said first location, and configured to place the cell in a second location in response to the sensitivity of the cell to lithographic variation being improvable by moving the cell.

22. The system of claim 21, wherein said circuit design has a leakage current having a sensitivity to lithographic variation, wherein said lithographically sensitive characterization data comprises lithographically sensitive leakage current data, and wherein said lithographic analysis device is configured to place the cell in a second location in response to said sensitivity to lithographic variation of said leakage current can being improvable by moving the cell.

23. The system of claim 21, wherein said circuit design has a timing performance having a sensitivity to lithographic variation, wherein said lithographically sensitive characterization data comprises lithographically sensitive timing data, and wherein said lithographic analysis device is configured to place the cell in a second location in response to said sensitivity to lithographic variation of said timing performance being improvable by moving the cell.

24. In a circuit design comprised of cells and having a sensitivity to lithographic variation, a method for placing the cells to minimize the sensitivity of the design to lithographic variation, the method comprising:
placing a first cell into a first location;
placing a second cell into a second location;
performing a lithographic simulation on said first cell representative of the likelihood of failure of said first cell in response to a plurality of fabrication conditions indicative of lithographic variation;
generating environment data from said lithographic simulation;
analyzing said environment data and said second location to determine if the sensitivity of the circuit design to lithographic variation is reducible by moving said second cell;
moving said second cell in response to determining that the sensitivity of the circuit design to lithographic variation is reducible by moving said second cell;
performing a lithographic simulation on said second cell representative of the likelihood of failure of said second cell in response to a plurality of fabrication conditions indicative of lithographic variation to produce additional environment data, wherein said analyzing said environment data comprises analyzing said additional environment data; and
performing optical proximity correction on said first cell to produce optical data, and wherein said lithographic simulation on said first cell is performed on said optical data.

25. The method of claim 24, further comprising
performing optical proximity correction on said second cell to produce additional optical data, and wherein said lithographic simulation is performed on said additional optical data.

* * * * *